United States Patent

Stoutimore et al.

(10) Patent No.: US 10,574,251 B1
(45) Date of Patent: Feb. 25, 2020

(54) JOSEPHSON ANALOG-TO-DIGITAL CONVERTER SYSTEM

(71) Applicants: Micah John Atman Stoutimore, Kensington, MD (US); Timothy A. Manning, Silver Spring, MD (US); Mark E. Nowakowski, Millersville, MD (US); Alexander Marakov, Columbia, MD (US)

(72) Inventors: Micah John Atman Stoutimore, Kensington, MD (US); Timothy A. Manning, Silver Spring, MD (US); Mark E. Nowakowski, Millersville, MD (US); Alexander Marakov, Columbia, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/290,373

(22) Filed: Mar. 1, 2019

(51) Int. Cl.
*H03M 1/00* (2006.01)
*H03M 1/12* (2006.01)
*H03K 19/195* (2006.01)

(52) U.S. Cl.
CPC ............ *H03M 1/12* (2013.01); *H03K 19/195* (2013.01)

(58) Field of Classification Search
CPC ...... H03M 1/12; H03M 1/0646; H03M 3/408; H03M 2201/516; H01L 39/223; H03K 19/195
USPC .................................................. 341/133, 155
See application file for complete search history.

(56) References Cited

U.S. PATENT DOCUMENTS

| | | | | |
|---|---|---|---|---|
| 6,157,329 A * | 12/2000 | Lee | ........................ | H03M 3/408 341/133 |
| 6,331,805 B1 * | 12/2001 | Gupta | ..................... | H03B 15/00 327/528 |
| 6,653,962 B2 * | 11/2003 | Gupta | .................... | G04F 10/005 341/133 |
| 7,227,480 B2 * | 6/2007 | Furuta | ...................... | H03K 3/38 341/126 |

(Continued)

FOREIGN PATENT DOCUMENTS

| | | |
|---|---|---|
| WO | 2014/028302 A2 | 2/2014 |
| WO | 2017/204977 A1 | 11/2017 |
| WO | 2018/044563 A1 | 3/2018 |

OTHER PUBLICATIONS

International Search Report and Written Opinion for PCT/US2019/019182 dated Jul. 19, 2019.

(Continued)

*Primary Examiner* — Jean B Jeanglaude
(74) *Attorney, Agent, or Firm* — Tarolli, Sundheim, Covell & Tummino LLP

(57) ABSTRACT

One example includes a Josephson analog-to-digital converter (ADC) system. The system includes a control line inductively coupled to an input signal line on which an input analog signal is provided. The input signal line can be inductively coupled to the control line to propagate an induced input current that is based on the input analog signal on the control line. The system also includes at least one Josephson transmission line (JTL) stage that is biased via a DC bias current and is configured to generate an output pulse in response to the induced input current and the DC bias current exceeding a predetermined threshold current associated with the at least one JTL stage.

20 Claims, 2 Drawing Sheets

(56) References Cited

U.S. PATENT DOCUMENTS

| | | | |
|---|---|---|---|
| 7,598,897 B2* | 10/2009 | Kirichenko | H03M 3/408 |
| | | | 341/143 |
| 8,188,901 B1* | 5/2012 | Inamdar | H03M 3/02 |
| | | | 341/156 |
| 9,312,878 B1* | 4/2016 | Inamdar | H03M 3/02 |
| 9,497,126 B2* | 11/2016 | Matsuhira | H04L 47/365 |
| 9,853,645 B1* | 12/2017 | Mukhanov | H01L 27/18 |
| 9,887,700 B2* | 2/2018 | Carmean | H03K 19/195 |
| 2005/0047245 A1 | 3/2005 | Furuta et al. | |
| 2006/0049891 A1* | 3/2006 | Crete | H01L 27/18 |
| | | | 333/99 S |
| 2010/0026537 A1* | 2/2010 | Kirichenko | H03M 3/408 |
| | | | 341/133 |

OTHER PUBLICATIONS

Non Final Office Action for U.S. Appl. No. 16/188,730 dated Aug. 29, 2019.

* cited by examiner

JOSEPHSON ANALOG-TO-DIGITAL CONVERTER SYSTEM

GOVERNMENT INTEREST

The invention was made under Government Contract. Therefore, the US Government has rights to the invention as specified in that contract.

TECHNICAL FIELD

This disclosure relates generally to computing systems, and more specifically to a Josephson analog-to-digital converter system.

BACKGROUND

Analog-to-digital converters (ADCs) are crucial components for computing technologies to implement logic functions. For example, ADCs are essential for both semiconductor-based and superconducting-based technology applications (computation, radar, sensors, communications, etc.) to convert analog information to digital information for processing. In many applications, the properties of ADCs can limit the overall device performance. As an example, superconducting ADCs can be especially attractive since their sensitivity and responsiveness metrics can be limited solely by fundamental constants and the magnetic flux response of associated Josephson junctions.

SUMMARY

One example includes a Josephson analog-to-digital converter (ADC) system. The system includes a control line inductively coupled to an input signal line on which an input analog signal is provided. The input signal line can be inductively coupled to the control line to propagate an induced input current that is based on the input analog signal on the control line. The system also includes at least one Josephson transmission line (JTL) stage that is biased via a DC bias current and is configured to generate an output pulse in response to the induced input current and the DC bias current exceeding a predetermined threshold current associated with the at least one JTL stage.

Another example includes a method for converting an analog input signal to an output pulse. The method includes providing the analog signal on an input signal line to inductively provide an induced input current on a control line. The method also includes providing a DC tuning current on a DC bias line to inductively provide a DC bias current on the control line. The method further includes providing a clock signal to at least one JTL stage that is coupled to the control line to generate the output pulse on an output from the at least one JTL stage at a predetermined phase of the clock signal in response to the induced input current and the DC bias current exceeding a predetermined threshold current associated with the at least one JTL stage.

Another example includes a Josephson ADC system. The system includes a control line inductively coupled to an input signal line on which an input analog signal is provided. The input signal line can be inductively coupled to the control line to propagate an induced input current that is based on the input analog signal on the control line. The system also includes a first JTL stage that is coupled to the control line and is biased via an induced DC bias current. The system further includes a second JTL stage that interconnects the control line and an output and which is configured to provide an output pulse on the output in response to the induced input current and the DC bias current exceeding a predetermined threshold current associated with the first and second JTL stages.

DETAILED DESCRIPTION

This disclosure relates generally to computing systems, and more specifically to a Josephson analog-to-digital converter (ADC) system. The Josephson ADC system can include a control line that is inductively coupled to an input signal line on which an input analog signal is provided. The input analog signal can be a current that corresponds to an analog signal to which a corresponding output pulse is provided at an output of the Josephson ADC system. For example, the output pulse can correspond to a single flux quantum (SFQ) pulse that is provided in response to the analog input signal having an amplitude that exceeds a predetermined threshold. The analog input signal can thus inductively provide an induced input current on the control line, such as via a transformer.

The control line can be coupled to at least one Josephson transmission line (JTL) stage that is configured to provide the output pulse in response to the analog input signal. For example, a DC tuning current can be provided via a DC bias line to inductively provide a DC bias current on the control line. Therefore, in response to the induced input current and the DC bias current exceeding a predetermined current threshold, the JTL stage(s) can provide the output pulse on an output. For example, the control line can interconnect a pair of substantially identical JTL stages that are coupled to a clock line that provides a clock signal (e.g., a reciprocal quantum logic (RQL) clock signal). Therefore, the JTL stages can balance the clock signal based on destructive interference, as described in greater detail herein, and can bias the JTL stages to provide the output pulse at a predetermined phase of the clock signal. Therefore, the Josephson ADC system can operate in a superconducting computer environment to provide a digital output pulse in response to an analog signal.

Figure 1:
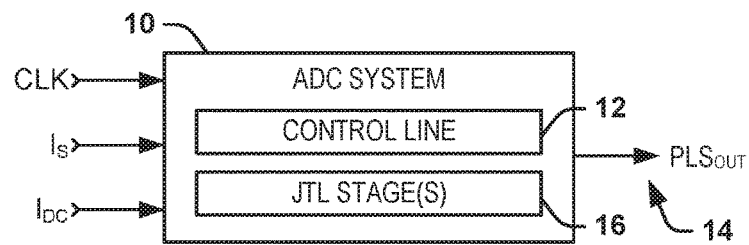
FIG. 1 illustrates an example of a Josephson ADC system.

FIG. 1 illustrates an example of a Josephson ADC system 10. The Josephson ADC system 10 can correspond to an ADC that can be implemented in any of a variety of computer applications for converting an analog signal to a digital representation. For example, the Josephson ADC system 10 can be implemented in a superconducting and/or classical computing environment to provide analog-to-digital conversion.

The Josephson ADC system 10 includes a control line 12 that can be arranged as a signal conductor, such as including one or more inductors that can correspond to secondary windings of respective transformers that is inductively coupled to an input signal line on which an input analog signal $I_S$ is provided. The input analog signal $I_S$ can be a current that corresponds to an analog signal to which a corresponding output pulse, demonstrated in the example of FIG. 1 as a signal "$PLS_{OUT}$", is provided at an output 14 of the Josephson ADC system 10. For example, the output pulse $PLS_{OUT}$ can correspond to a single flux quantum (SFQ) pulse that is provided in response to the analog input signal $I_S$ having an amplitude that exceeds a predetermined threshold. The analog input signal $I_S$ can thus inductively provide an induced input current on the control line 12, such as via a transformer.

The control line 12 can be coupled to at least one Josephson transmission line (JTL) stage 16 that is configured to provide the output pulse $PLS_{OUT}$ in response to the analog input signal $I_S$. In the example of FIG. 1, a DC tuning current $I_{DC}$ is also demonstrated as provided to the control line 12, such as via a DC bias line, to inductively provide a DC bias current on the control line 12. Therefore, in response to the induced input current and the DC bias current exceeding a predetermined current threshold, the JTL stage(s) 16 can provide the output pulse $PLS_{OUT}$ on the output 14. Additionally, in the example of FIG. 1, a clock signal CLK is provided to the Josephson ADC system 10, such that the clock signal CLK can be coupled to the JTL stage(s) 16. Therefore, the JTL stage(s) can be biased by the clock signal CLK in addition to the DC bias current provided via the DC tuning current $I_{DC}$ to provide the output pulse $PLS_{OUT}$ at a predetermined phase of the clock signal CLK. For example, the clock signal CLK can be a reciprocal quantum logic (RQL) clock signal that is implemented in RQL circuits. Therefore, the Josephson ADC system 10 can operate in a superconducting computer environment to provide a digital output pulse (e.g., the output pulse $PLS_{OUT}$), in response to an analog signal (e.g., the analog input signal $I_S$).

Figure 2:
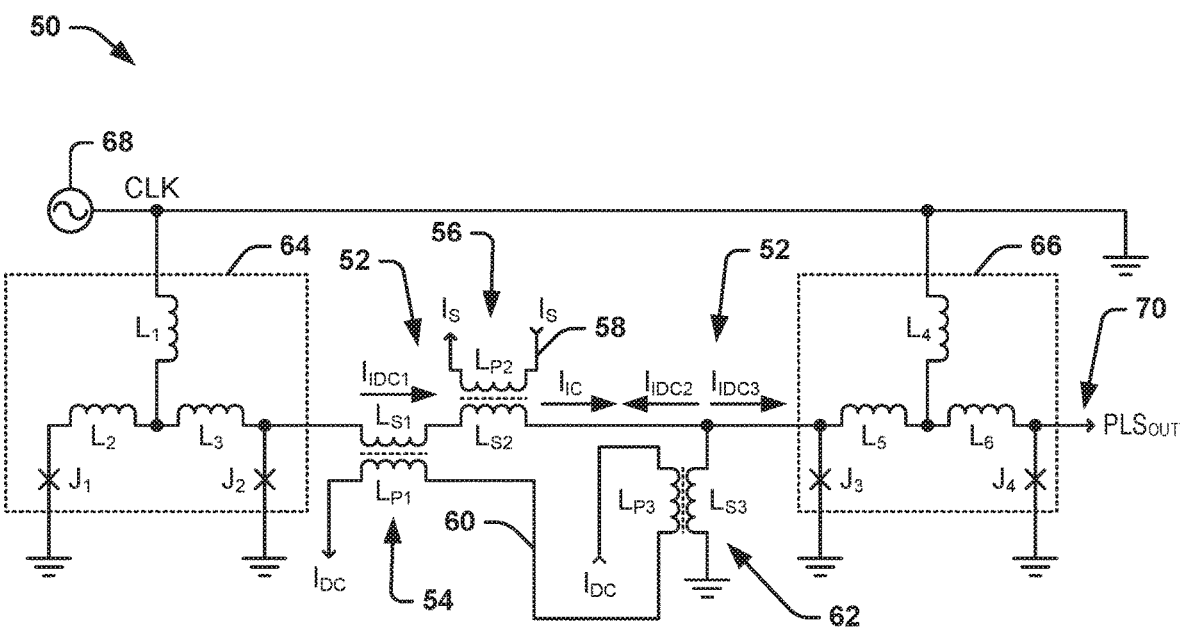
FIG. 2 illustrates an example circuit diagram of a Josephson ADC system.

FIG. 2 illustrates an example circuit diagram of a Josephson ADC system 50. The Josephson ADC system 50 can correspond to the Josephson ADC system 10 in the example of FIG. 1. For example, the Josephson ADC system 50 can be implemented in a superconducting and/or classical computing environment to provide analog-to-digital conversion. Therefore, reference is to be made to the example of FIG. 1 in the following description of the example of FIG. 2.

The Josephson ADC system 50 includes a control line 52 that is demonstrated as a signal conductor. In the example of FIG. 2, the Josephson ADC system 50 includes a first transformer 54 that includes a primary winding $L_{P1}$ and a secondary winding $L_{S1}$, and also includes a second transformer 56 that includes a primary winding $L_{P2}$ and a secondary winding $L_{S2}$. The primary winding $L_{P1}$ is coupled to a DC bias line 60 that is configured to conduct a DC tuning current $I_{DC}$, such that the secondary winding $L_{S1}$ is configured to generate a first induced DC bias current $I_{IDC1}$ that is proportional to the DC tuning current $I_{DC}$. The primary winding $L_{P2}$ is coupled to an input signal line 58 that is configured to conduct an analog input signal $I_S$, such that the secondary winding $L_{S2}$ is configured to generate an induced input current $I_{IC}$ corresponding to the analog input signal $I_S$. The secondary windings $L_{S1}$ and $L_{S2}$ are arranged in series with respect to each other on the control line 52.

Additionally, the Josephson ADC system 50 includes a third transformer 62 that includes a primary winding $L_{P3}$ and a secondary winding $L_{S3}$. The primary winding $L_{P3}$ is coupled to the DC bias line 60, and the secondary winding $L_{S3}$ interconnects the control line 52 and a low-voltage rail (e.g., ground). Therefore, secondary winding $L_{S3}$ generates an induced current that is a sum of a second induced DC bias current $I_{IDC2}$ and a third induced DC bias current $I_{IDC3}$ that propagate in opposite directions on the control line 52. As an example, the inductive coupling of the first and third transformers 54 and 62 can be different, such that the first induced DC bias current $I_{IDC1}$ and the sum of the second and third induced DC bias currents $I_{IDC2}$ and $I_{IDC3}$ can be unequal, as described in greater detail herein.

The Josephson ADC system 52 also includes a first JTL stage 64 and a second JTL stage 66 that are arranged on opposite respective ends of the control line 52. The first JTL stage 64 includes an inductor $L_1$ that provides a clock signal CLK from a clock source 68. As an example, the clock signal CLK can correspond to an RQL clock signal, such that as provided in an RQL circuit, and can thus be aligned with a predetermined phase of the RQL clock signal. The first JTL stage 64 also includes an inductor $L_2$ that is coupled to a Josephson junction $J_1$ that interconnects the inductor $L_2$ and the low-voltage rail. The first JTL stage 64 further includes an inductor $L_3$ that is coupled to the control line 52 and a Josephson junction $J_2$ that interconnects the control line 52 and the low-voltage rail. The first JTL stage 64 is thus arranged as a superconducting quantum interference device (SQUID) that receives the clock signal CLK.

The second JTL stage 66 includes an inductor $L_4$ that provides the clock signal CLK from the clock source 68. The second JTL stage 66 also includes an inductor $L_5$ that is coupled to the control line 52 and a Josephson junction $J_3$ that interconnects the control line 52 and the low-voltage rail. The second JTL stage 66 further includes an inductor $L_6$ that is coupled to an output 70 and to a Josephson junction $J_4$ that interconnects the inductor $L_6$ and the low-voltage rail. As described herein, the output 70 provides an output pulse $PLS_{OUT}$ in response to the analog input signal $I_S$. As an example, the output pulse $PLS_{OUT}$ can be provided as an SFQ pulse, such as provided along a Josephson transmission line (not shown) to further downstream superconducting circuit(s). The second JTL stage 66 is thus arranged as a SQUID that receives the clock signal CLK, similar to the first JTL stage 64. Additionally, the Josephson junctions $J_2$ and $J_3$ between the control line 52 likewise form a SQUID, such that the JTL stages 64 and 66 cooperate to trigger in response to the analog input signal $I_S$ achieving a predetermined threshold amplitude, as described herein.

As an example, the first and second JTL stages 64 and 66 can be arranged substantially identically with respect to the components arranged therein. The substantially identical arrangement of the JTL stages 64 and 66 can also provide balance for the Josephson ADC system 50, such as with respect to the clock signal CLK. For example, because the clock signal CLK is provided to both of the JTL stages 64 and 66 at the same phase, the clock signal CLK is provided through each of the inductors $L_3$ and $L_5$ to destructively combine at the control line 52. Therefore, the amplitude of the clock signal CLK does not interfere with the amplitude of the analog input signal $I_S$, or the induced input current $I_{IC}$ that is provided from the secondary winding $L_{S2}$.

The JTL stages 64 and 66 are configured to cooperatively provide the output pulse $PLS_{OUT}$ at the output 70 in response to an amplitude of the analog input signal $I_S$ being greater than a predetermined threshold. For example, the DC tuning current $I_{DC}$ can be set to a predetermined amplitude to bias the Josephson junctions $J_1$, $J_2$, $J_3$, and $J_4$, such that, in response to a sum of the analog input signal $I_S$ and the DC tuning current $I_{DC}$ being greater than a predetermined amplitude, the Josephson junctions $J_1$, $J_2$, $J_3$, and $J_4$ can trigger to provide the output pulse $PLS_{OUT}$ at the output 70, such as at a predetermined phase of the clock signal CLK (e.g., based on a further bias of the Josephson junctions $J_1$, $J_2$, $J_3$, and $J_4$ by the clock signal CLK).

As described previously, the inductive coupling of the first and third transformers 54 and 62 can be different, such that the first induced DC bias current $I_{IDC1}$ and the sum of the second and third induced DC bias currents $I_{IDC2}$ and $I_{IDC3}$ can be unequal. For example, the third transformer 62 can have a substantially greater inductive coupling than the first transformer 54. As a result, the first and second induced DC bias currents $I_{IDC1}$ and $I_{IDC2}$ can have amplitudes that are approximately equal, such that the amplitudes of the first and second induced DC bias currents $I_{IDC1}$ and $I_{IDC2}$ cancel each other in the portion of the control line 52 on which the secondary winding $L_{S2}$ of the second transformer 56 is provided. As a result, the induced DC current does not interfere with the analog input signal $I_S$, or the induced input current $I_{IC}$ that is provided from the secondary winding $L_{S2}$.

For example, the third induced DC bias current $I_{IDC3}$ can be configured to provide a bias to the Josephson junctions $J_3$ and $J_4$ in the second JTL stage 66. Therefore, the induced input current $I_{IC}$ combines with the third induced DC bias current $I_{IDC3}$. In response to the sum of the induced input current $I_{IC}$ and the third induced DC bias current $I_{IDC3}$ (e.g., and the amplitude of the clock signal CLK at the corresponding predetermined phase) being greater than a critical current associated with the Josephson junction $J_3$, the Josephson junction $J_3$ can trigger to provide a fluxon. The fluxon can thus likewise cause the Josephson junction $J_4$ to trigger to provide the output pulse $PLS_{OUT}$ at the output 70. Furthermore, based on the arrangement of the Josephson junctions $J_2$ and $J_3$ between the control line 52 to form a SQUID, the Josephson junctions $J_1$ and $J_2$ also trigger. As an example, the reflection of the triggering of the Josephson junction $J_1$ can also provide a reset of the Josephson junctions $J_1$, $J_2$, $J_3$, and $J_4$, such as at an opposite phase of the clock signal CLK. Alternatively, the Josephson junctions $J_1$, $J_2$, $J_3$, and $J_4$ can be reset by other means not demonstrated herein.

Therefore, as described herein, the Josephson ADC system 50 can operate in a superconducting computer environment to provide a digital output pulse (e.g., the output pulse $PLS_{OUT}$), in response to an analog signal (e.g., the analog input signal $I_S$). As described herein, the Josephson ADC system 50 can provide the analog-to-digital conversion in a manner that substantially mitigates noise associated with the tuning signal source (e.g., the DC tuning current $I_DC$) and the clock signal (e.g., the clock signal CLK) from affecting the analog input signal $I_S$. For example, as described previously, the Josephson ADC system 50 can be implemented in superconducting circuit environments in which the signal amplitudes can be very small. As a result, noise that can result from dominant signal sources, such as the DC tuning current $I_{DC}$ and the clock signal CLK, can be mitigated in the conversion of the small amplitude analog input signal $I_S$ to the small amplitude output pulse $PLS_{OUT}$. Accordingly, the Josephson ADC system 50 is demonstrated herein as a passive, robust, and application-independent method to convert low amplitude analog or digital electrical signals into discrete SFQ pulses, such as within an RQL architecture. As a result, for example, the Josephson ADC system 50 can provide a bridge between the RQL digital circuit logic family and a diverse array of signal sources (e.g., electrical signals produced by alternative superconducting logic families or analog signals generated from the readout of superconducting circuits).

Figure 3:
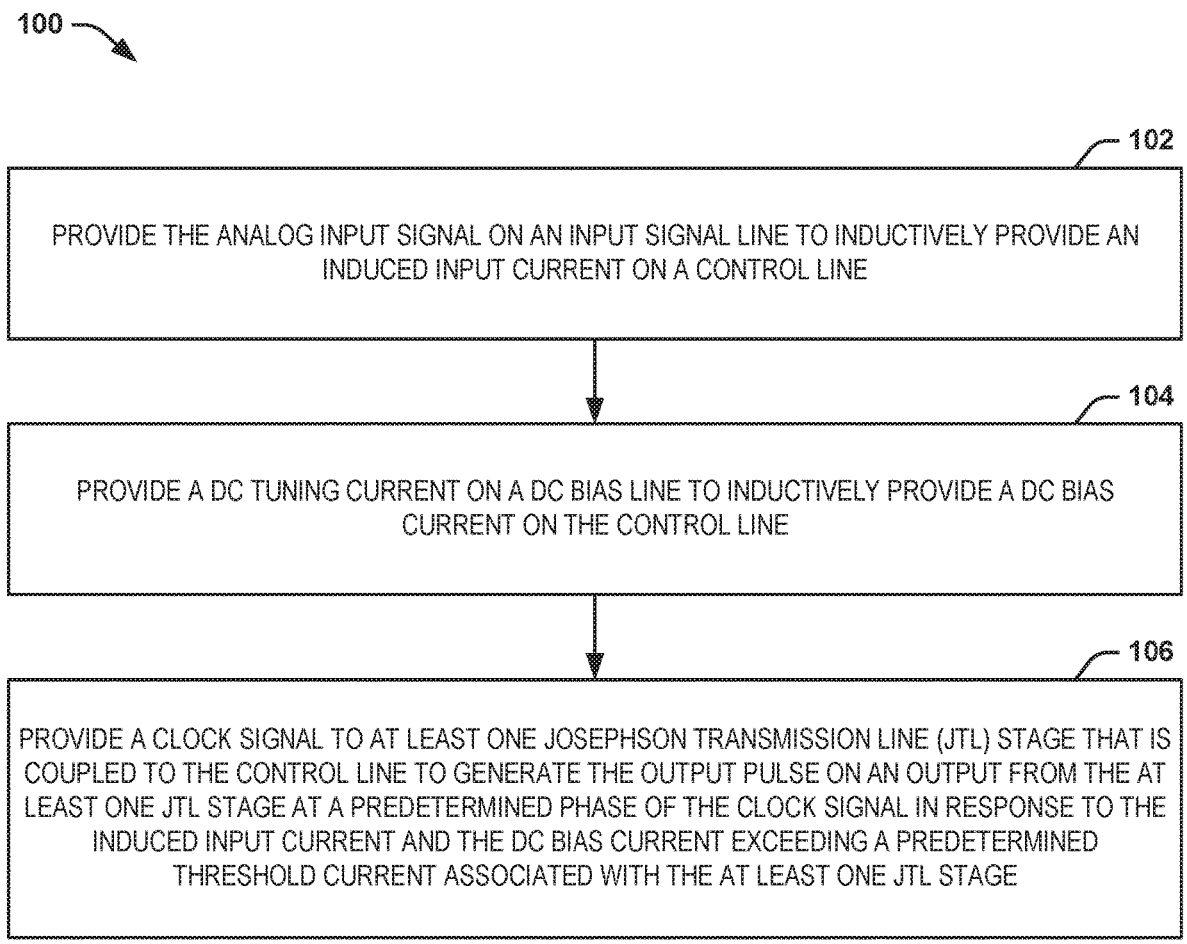
FIG. 3 illustrates an example of a method for converting an analog input signal to an output pulse.

In view of the foregoing structural and functional features described above, a methodology in accordance with various aspects of the present invention will be better appreciated with reference to FIG. 3. While, for purposes of simplicity of explanation, the methodology of FIG. 3 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 3 illustrates an example of a method 100 for converting an analog input signal (e.g., the analog input signal $I_S$) to an output pulse (e.g., the output pulse $PLS_{OUT}$). At 102, the analog input signal is provided on an input signal line (e.g., the input signal line 58) to inductively provide an induced input current on a control line (e.g., the control line 12). At 104, a DC tuning current (e.g., the DC tuning current $I_{DC}$) is provided on a DC bias line (e.g., the DC bias line 60) to inductively provide a DC bias current (e.g., the induced DC bias currents $I_{IDC1}$, $I_{IDC2}$, and $I_{IDC3}$) on the control line. At 106, a clock signal (e.g., the clock signal CLK) is provided to at least one Josephson transmission line (JTL) stage (e.g., the JTL stage(s) 16) that is coupled to the control line to generate the output pulse on an output (e.g., the output 14) from the at least one JTL stage at a predetermined phase of the clock signal in response to the induced input current and the DC bias current exceeding a predetermined threshold current associated with the at least one JTL stage.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A Josephson analog-to-digital converter system comprising:
   a control line inductively coupled to an input signal line on which an input analog signal is provided, the input signal line being inductively coupled to the control line to propagate an induced input current that is based on the input analog signal on the control line; and
   at least one Josephson transmission line (JTL) stage that is biased via a DC bias current and is configured to generate an output pulse in response to the induced input current and the DC bias current exceeding a predetermined threshold current associated with the at least one JTL stage.

2. The system of claim 1, further comprising a DC bias line that is inductively coupled to the control line, the DC bias line being configured to conduct a DC tuning current that inductively provides the DC bias current on the control line to bias the at least one JTL stage.

3. The system of claim 2, wherein the DC bias line is inductively coupled to the control line via a first transformer and a second transformer, wherein the induced input current is provided via a third transformer arranged on the control line between the first and second transformers.

4. The system of claim 3, wherein the induced DC bias current has approximately zero amplitude at a secondary winding of the third transformer.

5. The system of claim 4, wherein the first transformer comprises a first primary winding configured to propagate the DC tuning current and a first secondary winding configured to propagate a first portion of the DC bias current in a first direction on the control line, wherein the second transformer comprises a second primary winding configured to propagate the DC tuning current and a second secondary winding configured to propagate a second portion of the DC bias current in a second direction on the control line and a third portion of the DC bias current in the first direction on the control line, wherein the first portion and the second portion of the DC bias current are approximately equal.

6. The system of claim 4, wherein the first and second transformers are not equal with respect to the inductive coupling of the DC tuning current to provide the induced DC bias current to the control line.

7. The system of claim 1, wherein the at least one JTL stage comprises a first JTL stage and a second JTL stage that are arranged on opposite ends of the control line, wherein each of the JTL stages is arranged substantially the same.

8. The system of claim 7, wherein the first JTL stage comprises a first superconducting quantum interference device (SQUID) coupled to a clock signal and coupled to the control line, wherein the second JTL stage comprises a second SQUID coupled to the clock signal and interconnecting the control line and an output on which the output pulse is provided in response to the induced input current and the DC bias current exceeding the predetermined threshold current associated with the first and second JTL stages at a predetermined phase of the clock signal.

9. The system of claim 8, wherein the clock signal is a reciprocal quantum logic (RQL) clock signal.

10. The system of claim 7, wherein each of the first and second JTL stages are coupled to a clock signal, wherein the clock signal is configured to bias at least one Josephson junction associated with each of the first and second JTL stages at a respective phase of the clock signal and to destructively combine at the control line.

11. A method for converting an analog input signal to an output pulse, the method comprising:
providing the analog input signal on an input signal line to inductively provide an induced input current on a control line;
providing a DC tuning current on a DC bias line to inductively provide a DC bias current on the control line;
providing a clock signal to at least one Josephson transmission line (JTL) stage that is coupled to the control line to generate the output pulse on an output from the at least one JTL stage at a predetermined phase of the clock signal in response to the induced input current and the DC bias current exceeding a predetermined threshold current associated with the at least one JTL stage.

12. The method of claim 11, wherein providing the DC tuning current comprises providing the DC tuning current to the DC bias line that is inductively coupled to the control line via a first transformer and a second transformer, wherein the induced DC bias current is provided via a third transformer arranged on the control line between the first and second transformers.

13. The method of claim 12, wherein providing the DC tuning current further comprises inductively providing the induced DC bias current at approximately zero amplitude at a secondary winding of the third transformer.

14. The method of claim 11, wherein providing the clock signal comprises providing the clock signal as a reciprocal quantum logic (RQL) clock signal, wherein the at least one JTL stage comprises a first JTL stage and a second JTL stage that are arranged on opposite ends of the control line, wherein the first JTL stage comprises a first superconducting quantum interference device (SQUID) coupled to the RQL clock signal and coupled to the control line, wherein the second JTL stage comprises a second SQUID coupled to the RQL clock signal and interconnecting the control line and the output.

15. The method of claim 14, wherein providing the RQL clock signal comprises providing the RQL clock signal to each of the first and second JTL stages to bias at least one Josephson junction associated with each of the first and second JTL stages at a respective phase of the RQL clock signal and to destructively combine at the control line.

16. A Josephson analog-to-digital converter system comprising:
a control line inductively coupled to an input signal line on which an input analog signal is provided, the input signal line being inductively coupled to the control line to propagate an induced input current that is based on the input analog signal on the control line; and
a first Josephson transmission line (JTL) stage that is coupled to the control line and is biased via an induced DC bias current; and
a second JTL stage that interconnects the control line and an output and which is configured to provide an output pulse on the output in response to the induced input current and the DC bias current exceeding a predetermined threshold current associated with the first and second JTL stages.

17. The system of claim 16, further comprising a DC bias line that is inductively coupled to the control line via a first transformer and a second transformer, wherein the induced input current is provided via a third transformer arranged on the control line between the first and second transformers, the DC bias line being configured to conduct a DC tuning current that inductively provides the DC bias current on the control line to bias the first and second JTL stages such that the induced DC bias current has approximately zero amplitude at a secondary winding of the third transformer.

18. The system of claim 17, wherein the first and second transformers are not equal with respect to the inductive coupling of the DC tuning current to provide the induced DC bias current to the control line.

19. The system of claim 16, wherein the first JTL stage comprises a first superconducting quantum interference device (SQUID) coupled to the RQL clock signal and coupled to the control line, wherein the second JTL stage comprises a second SQUID coupled to the RQL clock signal and interconnecting the control line and the output.

20. The system of claim 16, wherein each of the first and second JTL stages are coupled to a clock signal, wherein the clock signal is configured to bias at least one Josephson junction associated with each of the first and second JTL stages at a respective phase of the clock signal and to destructively combine at the control line.

* * * * *